Aug. 24, 1965 A. D. GOMEZ 3,202,905

REMOTELY CONTROLLED ATTENUATOR DEVICES

Filed Jan. 2, 1962

INVENTOR
Aldan D. Gomez

BY Strauch, Nolan & Neale
ATTORNEYS

United States Patent Office 3,202,905
Patented Aug. 24, 1965

3,202,905
REMOTELY CONTROLLED ATTENUATOR DEVICES

Aldan D. Gomez, San Diego, Calif., assignor to Straza Industries, El Cajon, Calif., a corporation of California Filed Jan. 2, 1962, Ser. No. 163,776
4 Claims. (Cl. 323—74)

This invention relates to electrical attenuator or impedance varying devices which may be controlled at a location remote from the position of device, and more specifically to a novel combination of light sources and photoconductive elements so related as to provide control of impedance or resistance in a first circuit containing the photoconductive elements by varying the voltage in a totally separate circuit which controls the light emitted from the light sources individual to each photoconductive element.

Light amplifiers utilizing electroluminescent layers as light sources and photoconductive elements composed of layers of various semiconductor materials such as CdS, CdSe and the like are well known. It has been proposed in U.S. Patent No. 2,904,696 to control the impedance in a circuit containing a single photoconductive element by varying the voltage applied to the electroluminescent layer in an entirely separate circuit. This offers an attractive arrangement for the remote control of circuits which require shielding or special wire, but does not offer adequate control or regulation with sufficient sophistication, of the voltage and/or current supplied to load circuits under certain operating conditions.

A principal object of the present invention resides in providing a novel six terminal, plug in unit which contains an improved variable impedance circuit containing a pair of photoconductive elements connected electrically in series and a separate light source for each, with means to vary the light output from the light sources individually. By this arrangement it has been found possible to provide improved sensitivity of the control box and refined control including an extension of the dynamic range of the attenuation as compared with a single stage control as shown in the prior art.

Another object of the invention is to provide a novel compact circuit component having a pair of attenuation stages for varying the voltage applied to a load circuit from a source of voltage which itself is not necessarily controlled, and which is adapted to provide improved variable attenuation for both high impedance and low impedance load circuits.

A further object is to provide a two stage attenuator with control in a remote circuit and adapted for connection to the attenuator so that the attenuation of one stage will vary inversely with the attenuation of the other stage or the attenuation of both stages will vary together in the same direction depending upon the magnitude of the load impedance. For low impedance load circuits a fixed resistor is connected in parallel with a series circuit composed of one only of the attenuator stages and the load circuit to further extend the dynamic range of the attenuator. These and other objects of the invention will become more fully apparent from the claims, and the description as it proceeds in connection with the drawings wherein:

Figure 1:
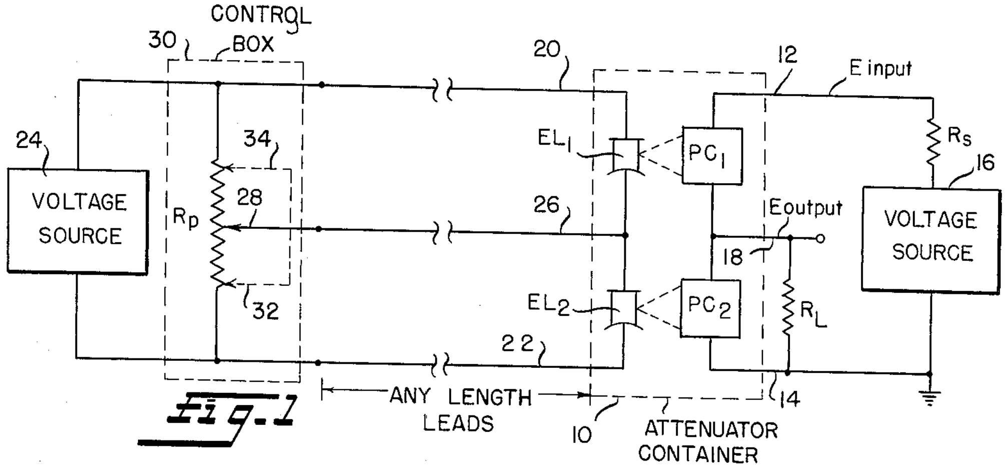
FIGURE 1 is a circuit diagram showing the novel two stage attenuator component of the present invention connected in a typical high impedance load circuit.
Figures 2, 3:
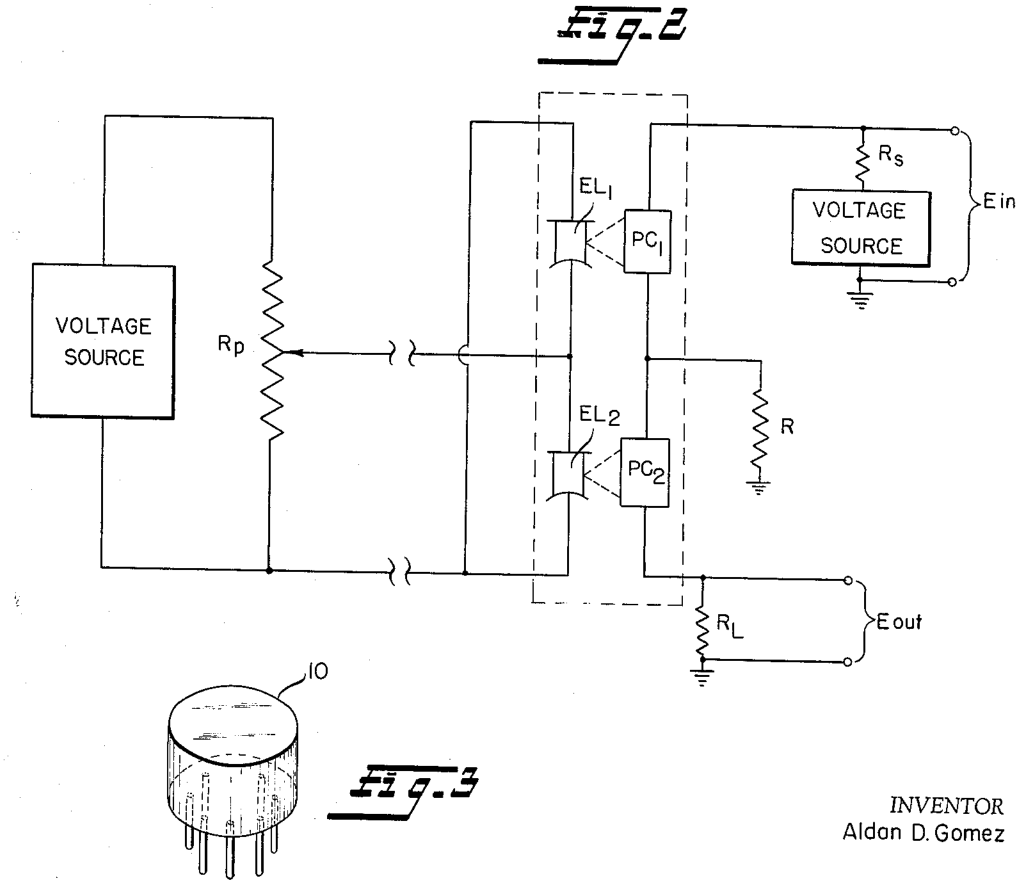
FIGURE 2 is a circuit diagram showing the same attenuator component of FIGURE 1 connected in a representative low impedance load circuit.
FIGURE 3 is a pictorial view of the compact attenuator component package incorporating the present invention.

Referring now to FIGURES 1 and 3, the attenuator container 10 may be a small protective hermetically sealed housing of an opaque material. The several prongs extending from one side of the housing correspond to terminals 12 and 14 which are adapted for connection across voltage source 16 and terminal 18 which is adapted for connection to one side of load resistor $R_L$ in the circuit of FIGURE 1. A pair of photoconductive elements $PC_1$ and $PC_2$, which may be photoresistors formed of a semiconductor material such as cadmium sulfide, cadmium selenide, lead sulfide or the like, are connected in series between terminals 12 and 14. Terminal 18 is connected to the common lead between photoconductive elements $PC_1$ and $PC_2$.

Associated with each photoconductive element $PC_1$ and $PC_2$ is a source of light which is preferably an electroluminescent layer $EL_1$ and $EL_2$. The dotted lines represent an opaque electromagnetic or light shield which prevents light from source $EL_1$ from affecting photoconductive element $PC_2$ and light from source $EL_2$ from affecting photconductive element $PC_1$.

Terminal 20 for light source $EL_1$ and terminal 22 for light sources $EL_2$ may be connected by leads of any length to a voltage source 24. Terminal 26, which is connected to the common point between light sources $EL_1$ and $EL_2$ may be connected to the movable tap 28 of a potentiometer $R_p$ in control box 30. The opposite ends of potentimeter $R_p$ are connected to voltage source 24.

The position of arm 28 of potentiometer $R_p$ in control box 30 divides the voltage $E_0 \sin \omega t$ (or it may be D.C. where light sources other than electroluminescent types are used) proportional to the shaft position. The voltages transmitted to light sources $EL_1$ and $EL_2$ are such that as the potential on light source $EL_1$ increases, the potential on light source $EL_2$ decreases. The light output varies with the applied potential, and the operation is referred to as differential.

The photoconductive devices also operate differentially in that when light is incident upon them, they are in their low impedance state and when light is absent, they are in their high impedance state. As the potential arm 28 is varied from one extreme position to the other, the impedance of device $PC_1$ or $PC_2$ varies from a maximum to a minimum while the impedance of the other device varies inversely from a minimum to a maximum. Thus the input impedance to devices $PC_1$ and $PC_2$ tends to be constant over a considerable range of operation of potentiometer $R_p$ in control box 30.

If the internal impedance $R_s$ of voltage source 16 is small, and the load resistance $R_L$ is high, i.e. when no appreciable current is drawn by the load, then $$E_{out}=E_{in}\frac{R_{pc_2}}{R_{pc_1}+R_{pc_2}} \quad (1)$$

and the output voltage $E_{out}$ between leads 18 and 14 across $R_L$ will be closely proportional to the setting of arm 28 on potentiometer $R_p$. For example, if arm 28 is set at dotted line position 32, the input voltage to light source $EL_1$ will be high to thereby cause the impedance of photoconductive device $PC_1$ to be low and at the same time the impedance of photoconductive device $PC_2$ will be high as there will be little or no light emitted from source $EL_2$. If arm 28 is set at dotted line position 34, the input voltage to light source $EL_2$ will be high to thereby cause the impedance of photoconductive device $PC_2$ to be low and the impedance of photoconductive device $PC_1$ will then be high.

Where the load resistance $R_L$ is low as to not be negligible:

$$E_{out}=E_{in}\frac{R_{pc_2}}{R_{pc_1}\left(1+\frac{R_{pc_2}}{R_L}\right)+R_{pc_2}} \quad (2)$$

In this situation the output voltage $E_{out}$ across $R_L$ is somewhat sensitive to load variations or low impedance loads and it may be desirable in such circumstances to use the circuit of FIGURE 2.

In the circuit of FIGURE 2 the two light sources $EL_1$ and $EL_2$ are connected in parallel so that the same voltage from the tap on potentiometer $R_p$ is applied to each. The impedance of the two photoconductive elements thus varies together. A resistor R of fixed value is placed in parallel with photoconductive element $PC_2$, and the load impedance $R_L$ having a small magnitude of resistance, is connected in series with the two photoconductive elements and thus a cascaded network composed of two stages of attenuation is provided. The following is true:

$$E_{out}=E_{in}\frac{R_L}{R_{pc_1}+R_{pc_2}+R_L+\frac{R_{pc_1}(R_{pc_2}+R_L)}{R}} \quad (3)$$

In this case it can be seen that $R_L$ may be made quite small without affecting the dynamic range of operation of the photoconductive devices, and variations greater than 100 db may be obtained.

The foregoing circuit arrangements provide a device which gives smooth variations or changes in impedance by photoconductive devices $PC_1$ and $PC_2$ that are proportional to displacements of arm 28 of the potentiometer. Depending upon wiring configuration, the device may be linear or non-linear in variation of $E_{out}$ vs. $R_p$.

Advantages of the circuit are that the nature of voltage source 16 may be of any type and the length of leads between source 16, photoconductive devices $PC_1$ and $PC_2$ and the load circuit may be very short. Where light sources $EL_1$ and $EL_2$ are electroluminescent devices, the alternating current power required may be applied through leads (which do not require shielding or special cable) of any length and the voltage magnitude adjusted by potentiometer $R_p$ at a position remote from the photoconductive devices or load. The voltage source 24 may even be D.C. if small lamps are used as light sources $EL_1$ and $EL_2$, though in such instance the attenuator container 10 would be more bulky than is possible where the electroluminescence devices are used. The input impedance for voltage source 16 is fairly constant for all setting of potentiometer $R_p$, and the speed of response of the photoconductor devices is fast compared with the hand operated motion of arm 28 on potentiometer $R_p$.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A remotely controlled variable attenuator for use in a circuit between a voltage source and a load circuit to control the voltage applied to the load circuit, said attenuator comprising:

(a) a hermetically sealed housing having two terminal groups each consisting of three terminals;

(b) a pair of photoconductive elements in said housing connected in series circuit arrangement between two of one group of three terminals with the third terminal of said one group connected to a common point between said photoconductive elements;

(c) a pair of electroluminescent light sources arranged and positioned so that each illuminates only one photoconductive element;

(d) means connecting one terminal of said other group to both of said light sources and connecting the other two terminals of said other group to respective ones of said light sources whereby said light sources may be energized by a voltage applied between said one terminal and said other two terminals of said other group;

(e) a source of energizing voltage for said light sources including a potentiometer having a movable tap, positioned at a remote distance from said housing; and (f) conductor means connected from the movable tap of the potentiometer to the light sources for selectively varying the energizing voltage applied to said light sources by movement of the potentiometer tap so that the light intensity of both light sources is maximum at the same time to thus provide varying resistance between said one group terminals.

2. The variable attenuator as defined in claim 1 together with a voltage source;

(a) a load circuit to be energized by said voltage source;

(b) circuit means for connecting said voltage source to one of the two terminals of said one group and for connecting the load circuit to the other of said last mentioned two terminals; and (c) means connecting the two photoconductive elements in series between said voltage source and said load circuit.

3. In combination:

(a) a first source of voltage;

(b) a load impedance;

(c) circuit means for connecting the voltage source to the load impedance including a variable attenuator comprising:

(d) a pair of photoconductive elements connected in series circuit arrangement between said voltage source and said load impedance;

(e) an impedance element connected in parallel with one photoconductive element and said load impedance and in series with the other photoconductive element and said voltage source;

(f) a pair of light sources individual to each of said photoconductive elements; and (g) means including a potentiometer having one fixed terminal connected to different ones of said light sources and a movable tap connected across both of said light sources in parallel to vary simultaneously the voltage applied to said light sources and thereby vary the voltage applied to said load circuit by movement of said potentiometer tap.

4. In combination:

(a) a source of voltage;

(b) a load impedance;

(c) circuit means for connecting the voltage source to the load impedance including a variable attenuator comprising two substantially identical variable impedance elements with means for simultaneously changing the impedance of both elements together, said two impedance elements being connected in series circuit arrangement between said voltage source and said load impedance; and (d) a fixed resistance connected in parallel across a series circuit containing one of said impedance elements only and said load impedance.

References Cited by the Examiner

UNITED STATES PATENTS 2,736,848 2/56 Rose ................ 323—79

FOREIGN PATENTS 626,847 9/61 Canada.

1,093,883 12/60 Germany.

LLOYD McCOLLUM, *Primary Examiner.*